US010607557B2

(12) United States Patent
Zhao et al.

(10) Patent No.: US 10,607,557 B2
(45) Date of Patent: Mar. 31, 2020

(54) THIN FILM TRANSISTOR LIQUID CRYSTAL DISPLAY DEVICE COMPRISING A DUAL GATE ARRAY SUBSTRATE TO REDUCE DRIVE CIRCUITRY AND A DRIVING METHOD THEREOF

(71) Applicant: BOE TECHNOLOGY GROUP CO., LTD., Beijing (CN)

(72) Inventors: Weili Zhao, Beijing (CN); Jae Geon You, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 15/677,114

(22) Filed: Aug. 15, 2017

(65) Prior Publication Data

US 2018/0068626 A1 Mar. 8, 2018

(30) Foreign Application Priority Data

Sep. 5, 2016 (CN) .......................... 2016 1 0802671

(51) Int. Cl.
*G09G 3/36* (2006.01)
*G02F 1/1343* (2006.01)
(Continued)

(52) U.S. Cl.
CPC ......... *G09G 3/3655* (2013.01); *G02F 1/1368* (2013.01); *G02F 1/134336* (2013.01);
(Continued)

(58) Field of Classification Search
CPC ......... G02F 1/133512; G02F 1/134336; G02F 1/136209; G02F 1/136286; G02F 1/1368;
(Continued)

(56) References Cited

U.S. PATENT DOCUMENTS 4,931,787 A * 6/1990 Shannon ............. G02F 1/13624
345/100
8,441,456 B2 5/2013 Takahashi
(Continued)

FOREIGN PATENT DOCUMENTS

CN 101154361 A 4/2008
CN 103197480 A 7/2013
(Continued)

OTHER PUBLICATIONS

First Office Action for Chinese Patent Application No. 201610802671.9 dated Oct. 8, 2018.

*Primary Examiner* — Ram A Mistry
(74) *Attorney, Agent, or Firm* — Calfee, Halter & Griswold LLP

(57) ABSTRACT

An array substrate, a display device and a driving method thereof are provided. In the array substrate, in a first pixel unit constituting a display unit group, a TFT of the first sub-pixel and a TFT of the second sub-pixel are connected to the same data line. In the second pixel unit of the display unit group, a TFT of the second sub-pixel and a TFT of the third sub-pixel are connected to the same data line. A distance along a direction of the gate line between adjacent two sub-pixels having a data line between them is a first shielding size, a distance along the direction of the gate line exists between adjacent two sub-pixels having no data line between them is a second shielding size, and the second shielding size is smaller than the first shielding size.

7 Claims, 4 Drawing Sheets

(51) Int. Cl.
*G02F 1/1362* (2006.01)
*G02F 1/1368* (2006.01)
*H01L 27/12* (2006.01)
*G02F 1/1335* (2006.01)

(52) U.S. Cl.
CPC ..... *G02F 1/136286* (2013.01); *G09G 3/3659* (2013.01); *H01L 27/124* (2013.01); *G02F 1/133512* (2013.01); *G02F 1/136209* (2013.01); *G02F 2001/134345* (2013.01); *G02F 2201/40* (2013.01); *G09G 2300/0465* (2013.01); *G09G 2310/0205* (2013.01); *G09G 2310/0218* (2013.01); *G09G 2320/0242* (2013.01)

(58) Field of Classification Search
CPC .... G02F 2001/134345; G02F 2201/40; G09G 2300/0465; G09G 2310/0205; G09G 3/3655; G09G 3/3659; H01L 27/124
See application file for complete search history.

(56) References Cited

U.S. PATENT DOCUMENTS

| | | | |
|---|---|---|---|
| 2006/0125784 A1* | 6/2006 | Jang | G06F 1/1616 345/156 |
| 2008/0218465 A1* | 9/2008 | Tsou | G09G 3/3659 345/92 |
| 2011/0169769 A1* | 7/2011 | Takahashi | G06F 3/0412 345/174 |
| 2016/0314736 A1* | 10/2016 | Sang | G09G 3/3607 |
| 2018/0068626 A1 | 3/2018 | Zhao et al. | |

FOREIGN PATENT DOCUMENTS

| | | |
|---|---|---|
| CN | 105629611 A | 6/2016 |
| CN | 101685228 A | 3/2019 |
| GB | 2205191 A | 11/1988 |

* cited by examiner

THIN FILM TRANSISTOR LIQUID CRYSTAL DISPLAY DEVICE COMPRISING A DUAL GATE ARRAY SUBSTRATE TO REDUCE DRIVE CIRCUITRY AND A DRIVING METHOD THEREOF

CROSS-REFERENCE TO RELATED APPLICATIONS

The present application claims priority to Chinese Patent Application No. 201610802671.9, filed Sep. 5, 2016, and the entire contents of which are incorporated herein by reference.

TECHNICAL FIELD

The present disclosure relates to the field of display technology, and more particularly to an array substrate, a display device and a driving method thereof.

BACKGROUND

Thin film transistor liquid crystal display (TFT-LCD) is a flat panel display device having characteristics of small size, low power consumption, no radiation and relatively low production cost. Due to these reasons, the TFT-LCD has been widely applied in high-performance display field.

SUMMARY

Embodiments of the present disclosure provide an array substrate, a display device and a driving method thereof.

In an aspect of the embodiments of the present disclosure, an array substrate is provided, which includes two rows of gate lines and a row of pixel units between the two rows of gate lines, each pixel unit comprising at least a first sub-pixel, a second sub-pixel and a third sub-pixel, wherein adjacent two pixel units in different columns are respectively a first pixel unit and a second pixel unit, the first pixel unit and the second pixel unit constitute a display unit group, and at least one data line is disposed between the first pixel unit and the second pixel unit; in the first pixel unit, a thin film transistor (TFT) of the first sub-pixel and a TFT of the second sub-pixel are connected to the same data line, no data line is disposed between the second sub-pixel and the third sub-pixel, the TFT of the first sub-pixel and a TFT of the third sub-pixel are connected to a previous row of gate line, the TFT of the second sub-pixel is connected to a next row of gate line; TFTs in the second pixel unit are axially symmetrical to the TFTs in the first pixel unit with respect to the data line between the first pixel unit and the second pixel unit; in the second pixel unit, no data line is disposed between the first sub-pixel and the second sub-pixel, a TFT of the second sub-pixel and a TFT of the third sub-pixel are connected to the same data line, a TFT of the first sub-pixel and the TFT of the third sub-pixel are connected to a previous row of gate line, and the TFT of the second sub-pixel is connected to a next row of gate line; and a distance along a direction of the gate line between adjacent two sub-pixels having a data line therebetween is a first shielding size, and a distance along the direction of the gate line between adjacent two sub-pixels having no data line therebetween is a second shielding size, and the second shielding size is smaller than the first shielding size.

In another aspect of the embodiments of the present disclosure, there is provided a display device, including the above array substrate.

In yet another aspect of the embodiments of the present disclosure, there is provided a method for driving the display device described as above, including: scanning each row of sub-pixels successively, scanning each row of sub-pixels comprising inputting scanning signals simultaneously to two gate lines connected with a row of sub-pixels; for each display unit group in the row, distributing a data signal to be displayed by the display unit group according to connection between the sub-pixels of the display unit group and the data line, to obtain distributed data signal, the distributed data signal comprising data signal respectively corresponding to the data line connected to the display unit group; and supplying power to the sub-pixels connected to the data line through the data line according to the distributed data signal.

BRIEF DESCRIPTION OF THE DRAWINGS

In order to more clearly illustrate the technical solution in the embodiments of the present disclosure or in the related art, the drawings, which are intended to be used in the description of the embodiments or of the related art, will be briefly described below. It will be apparent that the drawings in the following description are merely examples of the present disclosure, and other drawings may be obtained by those skilled in the art without making creative work.

DETAILED DESCRIPTION

The technical solutions in the embodiments of the present disclosure will be described clearly and thoroughly in conjunction with the accompanying drawings. Apparently, the described embodiments are merely part of the embodiments of the present disclosure and are not intended to be exhaustive. Based on embodiments in the present disclosure, all other embodiments obtained by those of ordinary skill in the art without making creative work fall within the protective scope of the present disclosure.

Figure 1:
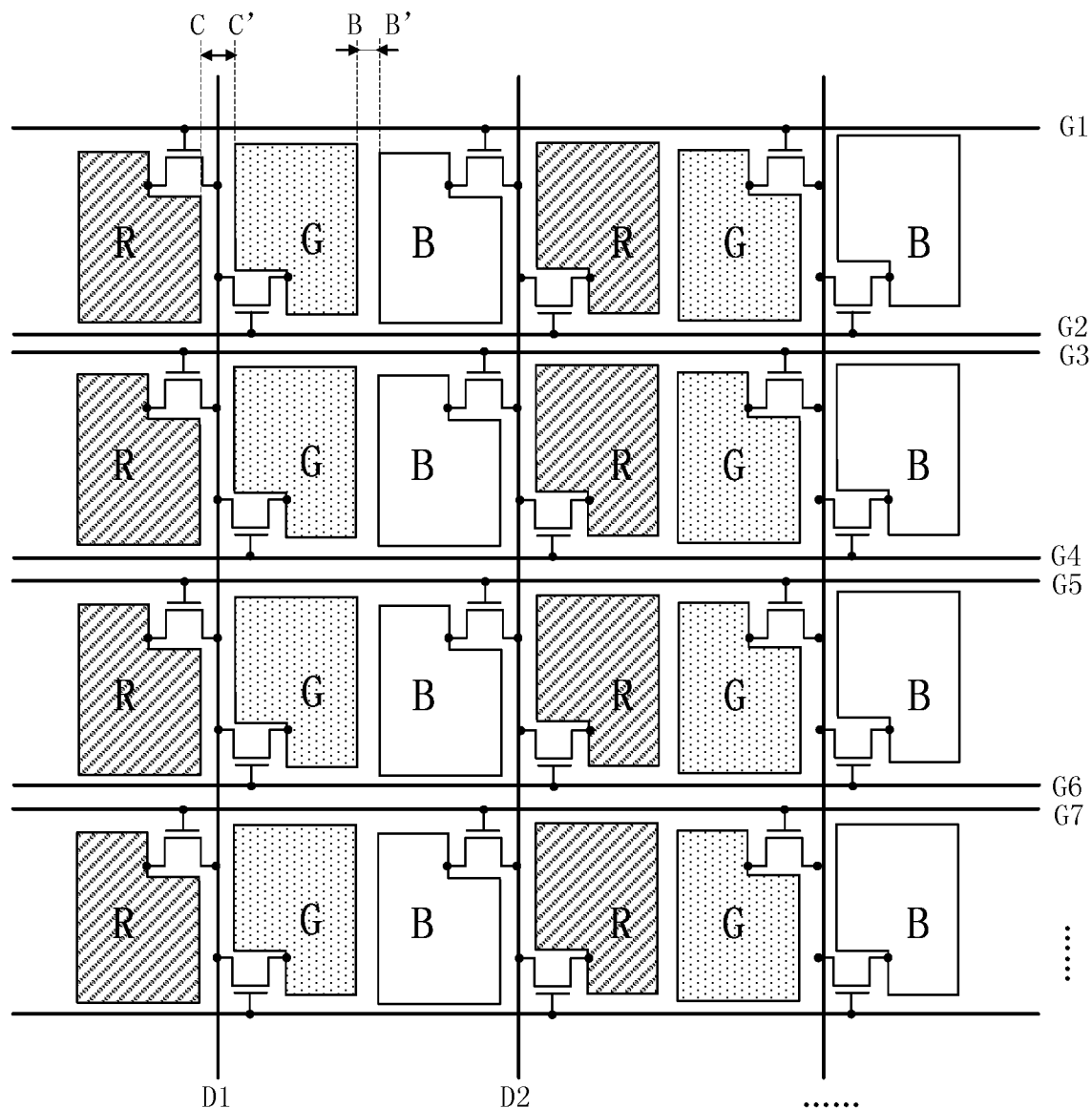
FIG. 1 is a structural schematic diagram of an array substrate in the related art.

In the related art, in order to reduce production cost, there is provided a dual gate array substrate. As shown in FIG. 1, in the array substrate, two rows of gate lines (such as G2 and G3) are disposed between two adjacent rows of sub-pixels (such as a first row R and a second row R). Two TFTs are disposed at intersection of the two rows of gate lines (G2 and G3) and the same data line (such as D1). Source electrodes of the two TFTs are connected to the same data line D1, and gate electrodes of the two TFTs are respectively connected to the gate line G2 and the gate line G3. Thus, no data line needs to be disposed between the two columns of sub-pixels between the data line D1 and the data line D2, to reduce the number of data lines. Therefore, the number of source driving chips connected to the data lines may be reduced, in order to reduce the cost.

Figure 2:
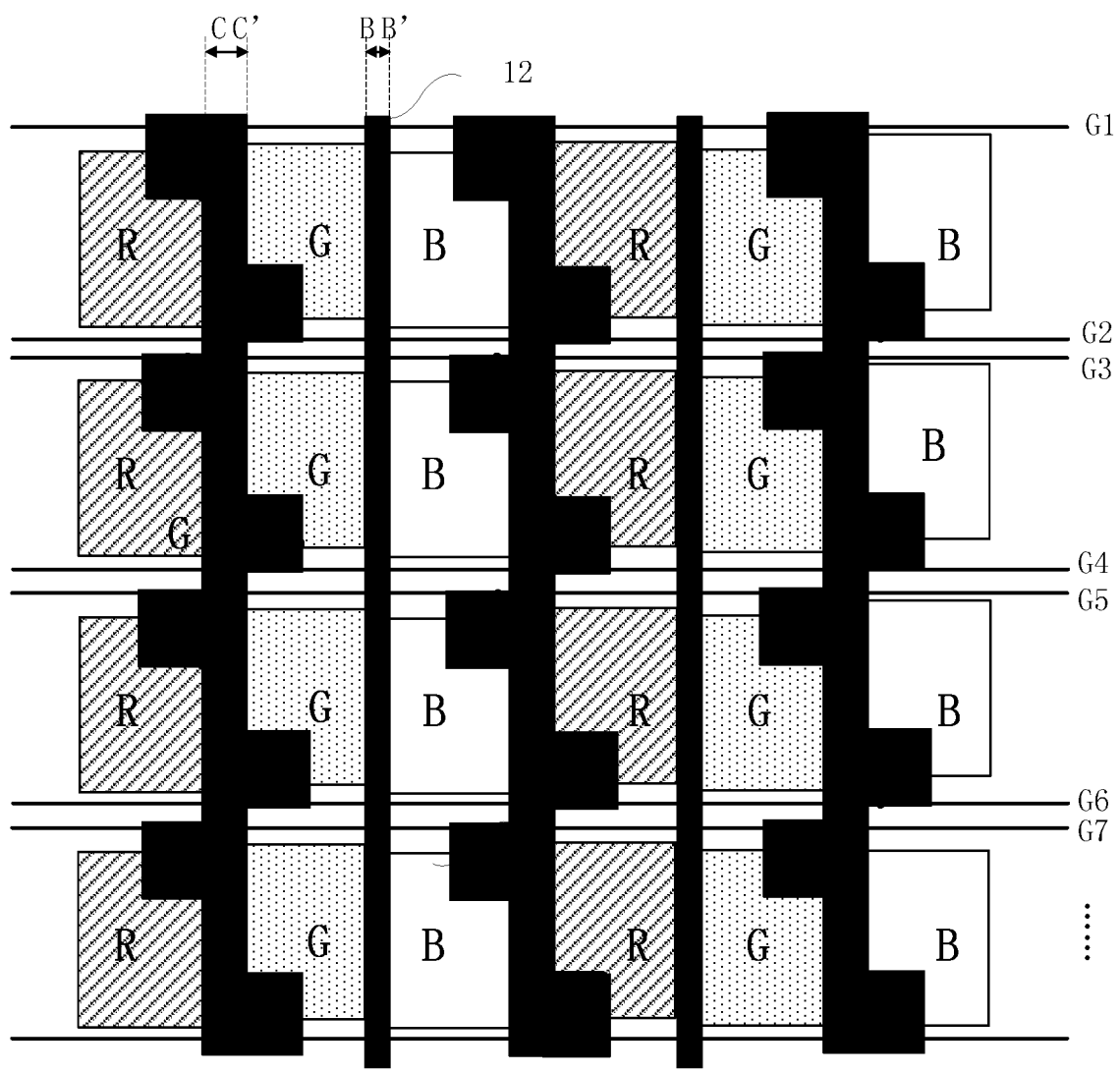
FIG. 2 is a schematic diagram of the array substrate of FIG. 1 covered with a black matrix.

Based on the above, when a data line is disposed between the two adjacent columns of sub-pixels, as shown in FIG. 2, a width of a black matrix (BM) 12 corresponding the position between the two columns of sub-pixels is CC'. When no data line is disposed between the two adjacent columns of sub-pixels, a width of a black matrix 12 corresponding the position between the two columns of sub-pixels is BB'. Since the matrix 12 having the width BB' corresponds to a position where no data line is disposed, the value of BB' may be smaller than that of CC'. In FIG. 2, the black matrix 12 covering gate lines are not illustrated.

In this case, in order to increase the active area (AA) of the sub-pixel, BB' may be reduced to increase the aperture ratio of the sub-pixel. However, this will increase the BM difference between BB' and CC', resulting in bright stripes and dark stripes (i.e. dim mura) during the display process, affecting the display effect.

Figure 3:
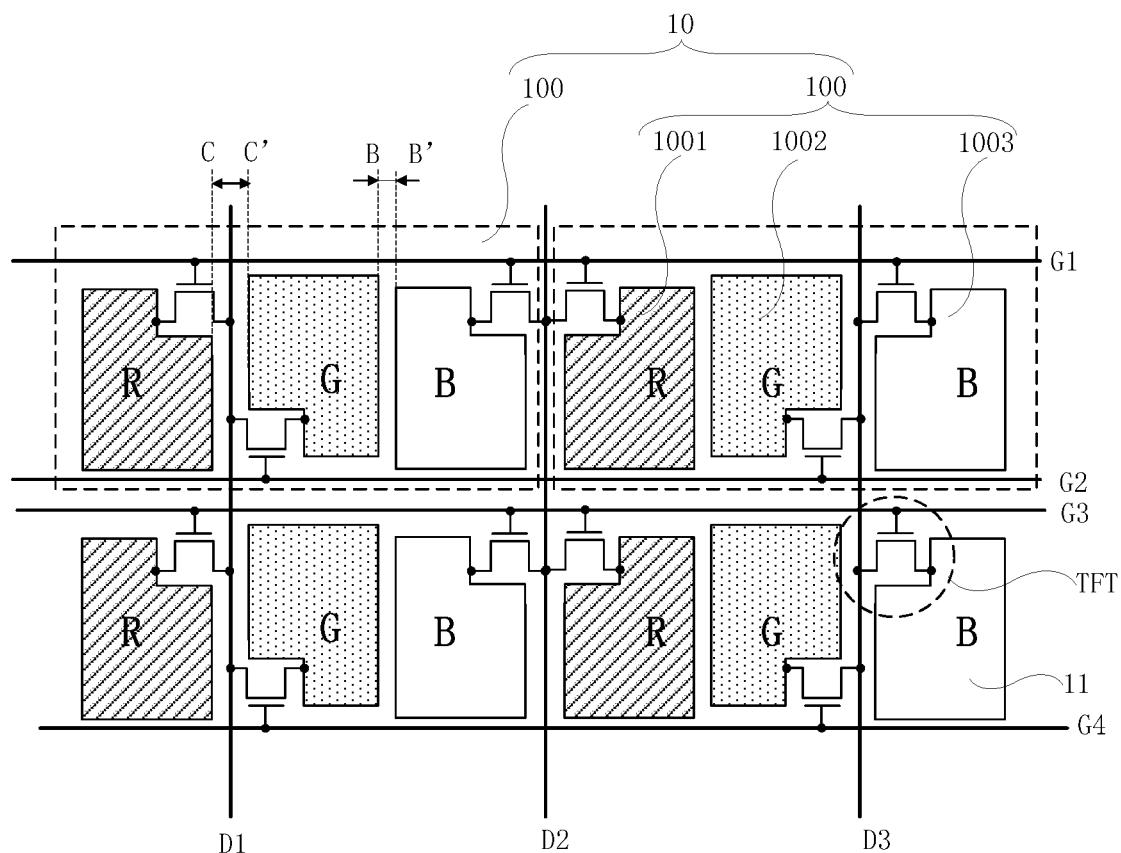
FIG. 3 is a structural schematic diagram of an array substrate according to an embodiment of the present disclosure.

The present disclosure provides an array substrate, as shown in FIG. 3, including two rows of gate lines (for example, G1 and G2) and one row of pixel units 100 between the two rows of gate lines (G1 and G2). Each pixel unit 100 includes at least a first sub-pixel 1001, a second sub-pixel 1002 and a third sub-pixel 1003.

It should be noted that the present disclosure does not limit the color displayed by the first sub-pixel 1001, the second sub-pixel 1002 and the third sub-pixel 1003, as long as it may ensure that lights respectively emitted by the first sub-pixel 1001, the second sub-pixel 1002 and the third sub-pixel 1003 constituting one pixel unit 100 may be mixed to form white light. For example, when white light is constituted by red light, green light and blue light, as shown in FIG. 3, the first sub-pixel 1001 may display red light (R), the second sub-pixel 1002 may display green light (G) and the third sub-pixel 1003 may display blue light (B). Alternatively, for example, when the white light is constituted by cyan light, magenta light and yellow light, the first sub-pixel 1001 may display cyan light, the second sub-pixel 1002 may display magenta light and the third sub-pixel 1003 may display yellow light. In addition, for easy illustration, in the following embodiments of the present disclosure, as an example, the first sub-pixel 1001 displays red light (R), the second sub-pixel 1002 displays green light (G) and the third sub-pixel 1003 displays blue light (B).

Figure 4:
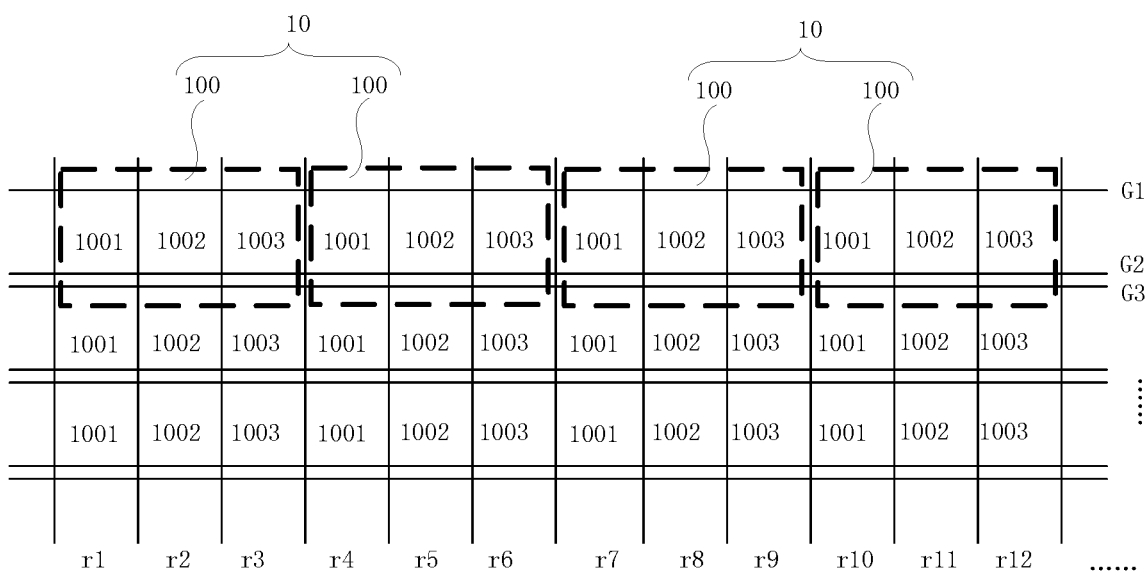
FIG. 4 is a schematic diagram of division of pixel units on the array substrate as shown in FIG. 3.

Base on the above, as shown in FIG. 3, adjacent two pixel units 100 in different columns on the array substrate are referred to as a first pixel unit (the pixel unit 100 on the left side) and a second pixel unit (the pixel unit 100 on the right side). The first pixel unit and the second pixel unit may constitute a display unit group 10. It should be noted that, pixel units 100 in any two adjacent display unit groups 10 are disposed in different columns. Specifically, as shown in FIG. 4, sub-pixels in the display unit group 10 on the left side cover the columns r1, r2, . . . r6, and sub-pixels in the display unit group 10 on the right side cover the columns r7, r8, . . . r12. On the array substrate, for sub-pixels in the same row, sub-pixels of every six successive columns from left to right may be taken as one display unit group 10.

Hereinafter, the configuration of the sub-pixels in the above display unit group 10 will be described in detail. Specifically, as shown in FIG. 3, in each display unit group 10, a TFT of a first sub-pixel 1001 and a TFT of a second sub-pixel 1002 in one pixel unit 100 (for example the pixel unit 100 on the left side, i.e. the first pixel unit) are connected to the same data line (such as D1). No data line is disposed between the second sub-pixel 1002 and a third sub-pixel 1003. The TFT of the first sub-pixel 1001 and a TFT of the third sub-pixel 1003 are connected to a previous row of a gate line (such as G1). The TFT of the second sub-pixel 1002 is connected to a next row of a gate line (such as G2).

As shown in FIG. 3, in each display unit group 10, a TFT of a third sub-pixel 1003 in a first pixel unit and a TFT of a first sub-pixel 1001 in a second pixel unit (such as B in the pixel unit 100 on the left side and R in the pixel unit 100 on the right side) are connected to the same data line (D2). Thus, it may avoid the problem of increased number of data lines and increased cost due to provision of different data lines separately for the TFTs of the above two sub-pixels (B and R).

Base on the above, TFTs in the another pixel unit 100 (for example the pixel unit 100 on the right side, i.e. the second pixel unit) of the display unit group 10 are axially symmetrical to the TFTs in the above first pixel unit with respect to the data line (such as D2) between the first pixel unit (the pixel unit 100 on the left side) and the second pixel unit (the pixel unit 100 on the right side). Moreover, in the second pixel unit, no data line is disposed between a first sub-pixel 1001 and a second sub-pixel 1002. A TFT of the second sub-pixel 1002 and a TFT of a third sub-pixel 1003 are connected to the same data line (such as D3). The TFT of the first sub-pixel 1001 and the TFT of the third sub-pixel 1003 are connected to the previous row of the gate line (such as G1). The TFT of the second sub-pixel 1002 is connected to the next row of the gate line (such as G2).

In addition, there is a distance (i.e. a first shielding size CC') along a direction of the gate line between adjacent two sub-pixels (such as R and G) having a data line (such as D1) between them, and there is a distance (i.e. a second shielding size BB') along the direction of the gate line between adjacent two sub-pixels (such as G and B) having no data line between them. The second shielding size BB' is smaller than the first shielding size CC'.

Figure 5:
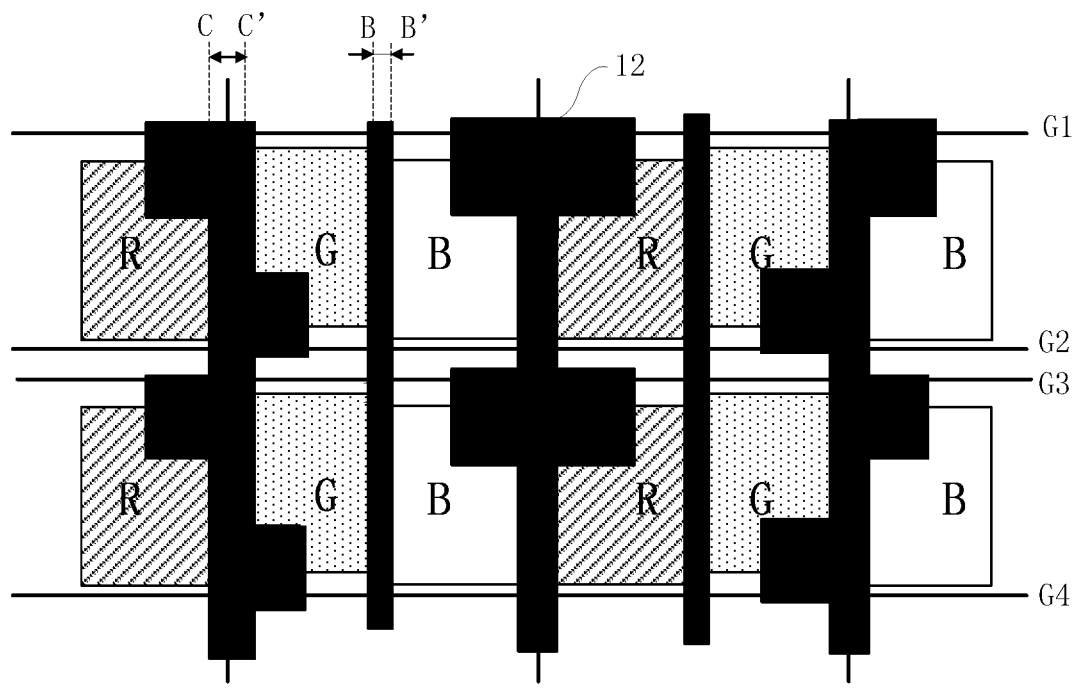
FIG. 5 is schematic diagram of the array substrate of FIG. 3 covered with a black matrix.

It should be noted that, the above shielding size refers to a black matrix 12 for shielding light disposed in the display panel constituted by the array substrate, as shown in FIG. 5 (herein, the black matrix 12 covering a gate line is not illustrated). Specifically, the positions of the black matrixes 12 respectively correspond to the positions of the above data lines, gate lines and TFTs, to prevent light leakage at the positions of the data lines, gate lines and TFTs. Based on the above, when a black matrix 12 is disposed between adjacent two sub-pixels (such as R and G) having a data line (such as D1) between them, a width of the black matrix 12 is the above first shielding size CC'. When a black matrix 12 is disposed between adjacent two sub-pixels (such as G and B) having no data line between them, a width of the black matrix 12 is the above second shielding size BB'. Since a data line is disposed between the adjacent two sub-pixels (such as G and B), the second shielding size BB' may be relatively reduced, such that the aperture ratio of the two sub-pixels (G and B) may be increased.

In addition, the above black matrixes 12 may be integrated on the array substrate. Alternatively, when the display panel constituted by the array substrate includes an opposite substrate to form a cell assembly with the array substrate, the above black matrixes 12 may be disposed on the opposite substrate. This is not limited in the present disclosure.

As used herein, orientation terms such as "left" and "right" are defined with respect to the schematic placement of the array substrate shown in the Figures. It should be understood that the orientation terms are relative concepts used for description and clarification with respect to a position, and may be changed correspondingly with change of orientation of the placement of the array substrate.

In summary, the black matrixes 12 may shield light emitted by the back light source. Since the black matrixes 12 are generally used to cover the gate lines, data lines and TFTs, for each row of sub-pixels, factors affecting brightness distribution of the sub-pixels in the row along a direction of the gate line include the first shielding size CC', the second shielding size BB' which are related to the positions of the above black matrixes 12, and the positions of the TFTs. Therefore, in the present disclosure, according to the above first shielding size CC', the second shielding size BB' and the positions of TFTs of the sub-pixels in one row, data of brightness distribution of the sub-pixels in each row may be obtained through mathematic analysis software. Then the above data of brightness distribution may be analyzed with Fourier finite difference method, to obtain the dim mura of the display panel constituted by the array substrate provided by the present disclosure during the display process, which has been reduced.

Hereinafter, the process of analyzing the data of brightness distribution with Fourier finite difference method will be described. (The data in Table 1 are all calculated through simulation)

TABLE 1

|  | Related Art | Present Disclosure |
| --- | --- | --- |
| CC' | 28.5 μm | 28.5 μm |
| BB' | 16 μm | 16 μm |
| BM difference | 8% | 8% |
| Positions of BMs covering TFTs | Positions of BMs respectively covering TFTs of Sub-pixels emitting light of the same color in adjacent two pixel units are asymmetric | Positions of BMs respectively covering TFTs of Sub-pixels emitting light of the same color in adjacent two pixel units are symmetric |
| Ratio of Dim Mura | 5% | 3.4% |

It should be noted that, the above BM difference (briefly BM dif.) is used to characterize a difference between the first shielding size CC' and the second shielding size BB', that is, a difference value between the first shielding size CC' and the second shielding size BB'. Specifically, the BM dif.= (CC'−BB')/2×Dot, where Dot denotes the size of a sub-pixel along the direction of the gate line.

On one hand, when the BM dif. is relatively small, for example, a difference between the first shielding size CC' and the second shielding size BB' is relatively small (for example, when the BM dif. is less than 2%, the difference between the first shielding size CC' and the second shielding size BB' is relatively small). However, since as shown in FIG. 5, when a black matrix 12 is disposed between adjacent two sub-pixels (such as R and G) having a data line (such as D1) between them, a width of the black matrix 12 is the above first shielding size CC'. The value of the first shielding size CC' cannot be produced to be small. Therefore, when the BM dif. is less than 10%, the value of the second shielding size BB' is relatively large, which inevitably affects the aperture ratio of the adjacent two sub-pixels (such as G and B) having no data line between them.

On the other hand, when the BM dif. is relatively large, for example, a difference between the first shielding size CC' and the second shielding size BB' is relatively large (for example, when the BM dif. is larger than 10%, the difference between the first shielding size CC' and the second shielding size BB' is relatively large). Then, the value of the second shielding size BB' is relatively small, and the aperture ratio of the adjacent two sub-pixels (such as G and B) having no data line between them is relatively large. However, it may increase the dim mura. Therefore, the BM dif. is preferably larger than or equal to 2%, and less than or equal to 10%. In one embodiment, the BM dif. is larger than or equal to 2%, and less than or equal to 8%.

Based on the above, even though in the related art, the BM dif. may fall in the above preferable range of the difference (for example, when the first shielding size CC' is 28.5 μm and the second shielding size BB' is 16 μm, the BM dif. is 8%), as shown in FIG. 1, since the TFTs of sub-pixels emitting light of the same color in adjacent two pixel units are asymmetric, the dim mura is 5% (the data of the bright distribution of the sub-pixels in each row may be obtained through mathematic analysis software according to the above first shielding size CC', the second shielding size BB' and the positions of the TFTs of the sub-pixels in one row, and then the data of the bright distribution may be analyzed through Fourier finite difference method to obtain the dim mura). This dim mura is obvious to the user.

However, when the BM dif. of the array substrate provided by the present disclosure has the same value 8%, that is, when the first shielding size CC' is 28.5 μm and the second shielding size BB' is 16 μm, the dim mura obtained through analysis of Fourier finite difference method on the data of brightness distribution by using MATLAB is 3.4%. Thus, the dim mura is reduced. Therefore, the present disclosure may reduce the dim mura ratio of the bright strips and the dark strips while ensuring the aperture ratio.

An embodiment of the present disclosure provides a display device, including any one array substrate described as above, which has the same structure and advantageous effect as the array substrate provided in the previous embodiments. Since the structure and advantageous effect of the array substrate provided in the previous embodiments have been described in detail, they will not be repeated herein.

Figure 6:
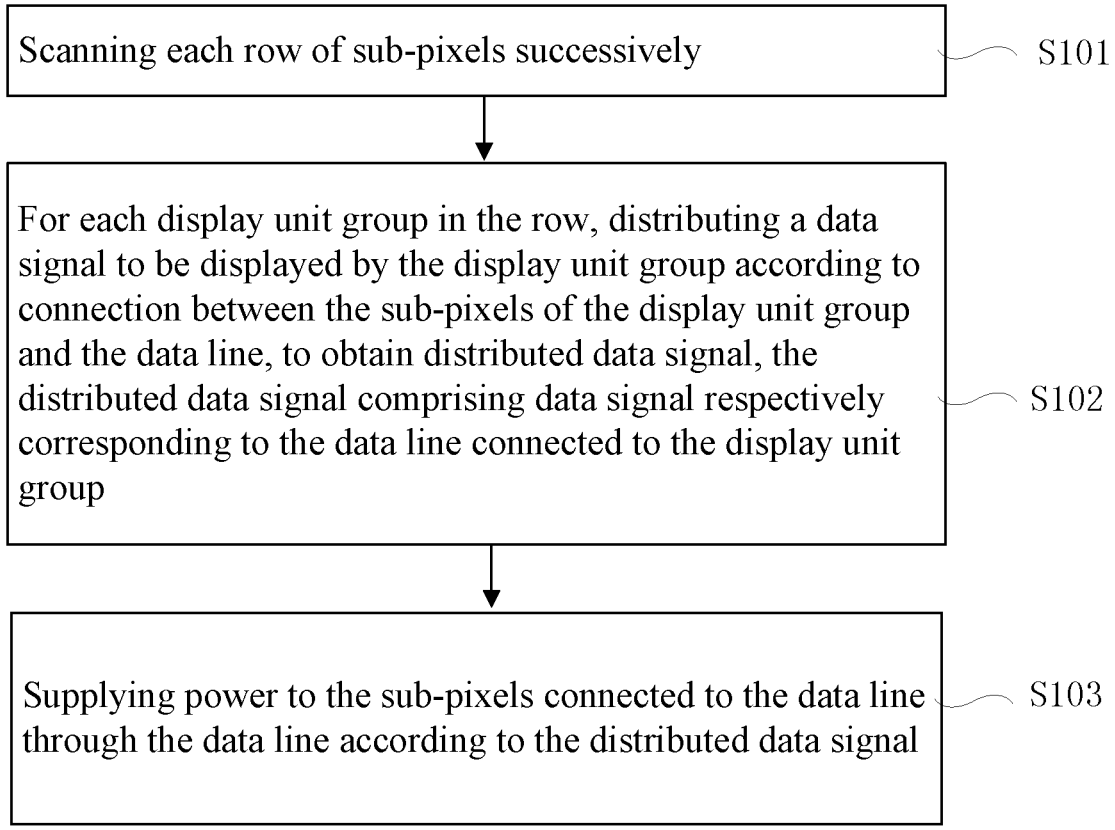
FIG. 6 is a flow chart of a driving method for a display device provided by the present disclosure.

An embodiment of the present disclosure provides a driving method for the above display device. As shown in FIG. 6, the driving method includes the following steps.

At step S101, each row of sub-pixels is scanned successively.

In this step, scanning each row of sub-pixels includes inputting a scanning signal simultaneously to two gate lines (G1 and G3 as shown in FIG. 3) connected with each row of sub-pixels, to turn on each TFT connected with each row of sub-pixels.

At step S102, for each display unit group 10 in each row, data signals to be displayed by the display unit group 10 are distributed according to the connection between the sub-pixels of that display unit group 10 and the data lines, to obtain the distributed data signals. The distributed data signals includes data signals respectively corresponding to the data lines connected to the display unit group 10.

Specifically, one display unit group 10 displays a gray-scale value including gray-scale values R, G and B. In this case, assuming that one pixel unit 100 (for example, a pixel unit 100 on the left side) constituting the display unit group 10 has a first sub-pixel 1001, a second sub-pixel 1002 and a third sub-pixel 1003 respectively for displaying gray-scale values R1, G1 and B1. In addition, another pixel unit 100 (for example, a pixel unit 100 on the right side) has a first sub-pixel 1001, a second sub-pixel 1002 and a third sub-pixel 1003 respectively for displaying gray-scale values R2, G2 and B2. In this case, the above distributing data signals to be displayed by the display unit group 10 according to the connection between the sub-pixels of the display unit group 10 and the data lines refers to, distributing the gray-scale values R, G and B as R1, G1 and B1, and R2, G2 and B2.

In addition, the connection between the sub-pixels of that display unit group 10 and the data lines refers to, as shown in FIG. 3, the first sub-pixel 1001 and the second sub-pixel 1002 in the left pixel unit 100 being connected to the same data line D1, the second sub-pixel 1002 and the third sub-pixel 1003 in the right pixel unit 100 being connected to the same data line D3, and the third sub-pixel 1003 in the left pixel unit 100 and the first sub-pixel 1001 in the right pixel unit 100 being connected to the same data line D2.

In this case, the above gray-scale values satisfy the following formulae.

$$R1=G1 \qquad (1);$$

$$B1=R2 \qquad (2);$$

$$G2=B2 \qquad (3);$$

$$a1 \times R1 + b1 \times R2 = R \qquad (4);$$

$$a2 \times G1 + b2 \times G2 = G \qquad (5);$$

$$a3 \times B1 + b3 \times B2 = B \qquad (6);$$

where a1, a2, a3, b1, b2 and b3 are ratio coefficients representing the ratio of the grey-scale values (such as R1 and R2) of two sub-pixels emitting light of the same color (such as red) in adjacent two pixel units to the total gray-scale value (such as R) of that color displayed by the entire display unit group 10.

Thus, since the gray-scale value displayed by the display unit group 10 includes known gray-scale values R, G and B, the six unknown values R1, G1 and B1, and R2, G2 and B2 to be distributed may be calculated through the above formulae (1) to (6), to implement the distribution process.

At step S103, according to the distributed data signal, the sub-pixels connected to the data line are supplied with power through the data line.

Specifically, the above calculated grey-scale values R1, G1 and B1, and R2, G2 and B2 may be transformed into corresponding data voltage, and the data voltage may be outputted to a pixel electrode 11 of a sub-pixel through a data line, to supply power to the sub-pixel.

In summary, the above driving method may drive the display device constituted by the array substrate as shown in FIG. 3 to display, which may have the same advantageous effect as the display device provided by the previous embodiment. Since the advantageous effect of the display device provided by the previous embodiment has been described in detail, it will not be repeated herein.

The foregoing are merely specific embodiments of the present disclosure and are not intended to limit the present disclosure. Those skilled in the art may conceive of variations or substitutions within the range disclosed by the present disclosure which should be covered by the scope of the present disclosure. Therefore, the scope of the present disclosure should be defined by the claims.

What is claimed is:

1. An array substrate, comprising: two rows of gate lines and one row of pixel units between the two rows of gate lines, each pixel unit comprising at least a first sub-pixel, a second sub-pixel and a third sub-pixel which are arranged along an extending direction of the gate lines, wherein:

adjacent two pixel units in different columns are respectively a first pixel unit and a second pixel unit, the first pixel unit and the second pixel unit constitute a display unit group, and at least one data line is disposed between the first pixel unit and the second pixel unit;

in the first pixel unit, a thin film transistor (TFT) of the first sub-pixel and a TFT of the second sub-pixel are connected to the same data line, no data line is disposed between the second sub-pixel and the third sub-pixel, the TFT of the first sub-pixel and a TFT of the third sub-pixel are connected to a previous row of gate line, the TFT of the second sub-pixel is directly connected to a next row of gate line;

areas on the substrate occupied by TFTs in the second pixel unit are axially symmetrical to areas on the substrate occupied TFTs in the first pixel unit with respect to the data line between the first pixel unit and the second pixel unit; in the second pixel unit, no data line is disposed between the first sub-pixel and the second sub-pixel, a TFT of the second sub-pixel and a TFT of the third sub-pixel are directly connected to a first same data line between the second sub-pixel and the third sub-pixel, a TFT of the first sub-pixel and the TFT of the third sub-pixel are connected to a previous row of gate line, and the TFT of the second sub-pixel is connected to a next row of gate line; and the third sub-pixel in the first pixel unit and the first sub-pixel in the second pixel unit are disposed adjacently, and the TFT of the third sub-pixel in the first pixel unit and the TFT of the first sub-pixel in the second pixel unit are directly connected a same gate line and a same second data line, and the same second data line is located between the third sub-pixel in the first pixel unit and the first sub-pixel in the second pixel unit;

areas on the substrate occupied by TFTs of same colored sub-pixels in the first and second pixel units are axially symmetrical with respect to an imaginary line perpendicular to a connection line for connection the same colored sub-pixels;

a distance along a direction of the gate line between adjacent two sub-pixels having a data line therebetween is a first shielding size, and a distance along the direction of the gate line between adjacent two sub-pixels having no data line therebetween is a second shielding size, and the second shielding size is smaller than the first shielding size.

2. The array substrate of claim 1, wherein a difference between the first shielding size (CC') and the second shielding size (BB') is within 2%~10%, the difference is (CC'−BB')/2×Dot, where Dot denotes a size of a sub-pixel along a direction of the gate line.

3. A display device, comprising the array substrate of claim 1.

4. The display device of claim 3, wherein black matrixes are disposed on the array substrate, and the black matrixes respectively correspond to positions of the data lines, gate lines and TFTs.

5. The display device of claim 3, further comprising an opposite substrate to form a cell assembly with the array substrate, wherein black matrixes are disposed on the opposite substrate, and the black matrixes respectively correspond to positions of the data lines, gate lines and TFTs on the array substrate.

6. A method for driving the display device of claim 3, comprising:

scanning each row of sub-pixels successively, scanning each row of sub-pixels comprising inputting scanning signals simultaneously to two gate lines connected with a row of sub-pixels;

for each display unit group in the row, distributing a data signal to be displayed by the display unit group according to connection between the sub-pixels of the display unit group and the data line, to obtain distributed data signal, the distributed data signal comprising data signal respectively corresponding to the data line connected to the display unit group; and supplying power to the sub-pixels connected to the data line through the data line according to the distributed data signal;

wherein distributing a data signal to be displayed by the display unit group according to connection between the sub-pixels of the display unit group and the data line comprises:

distributing gray-scale values R1, G1 and B1 to the first sub-pixel, the second sub-pixel and the third sub-pixel in the first pixel unit respectively, and distributing gray-scale values R2, G2 and B2 to the first sub-pixel, the second sub-pixel and the third sub-pixel in the second pixel unit respectively:

wherein:

$$R1=G1;$$

$$B1=R2;$$

$$G2=B2;$$

$$a1 \times R1 + b1 \times R2 = R;$$

$$a2 \times G1 + b2 \times G2 = G,$$

$$a3 \times B1 + b3 \times B2 = B,$$

where a1, a2, a3, b1, b2 and b3 are ratio coefficients representing the ratio of the grey-scale values of two sub-pixels emitting light of the same color in adjacent first and second units to the total gray-scale value of that color displayed by the entire display unit group, R, G and B represent total gray-scale values of red, green and blue color displayed by the entire display unit group.

7. The display device of claim 1, wherein active areas of the same colored sub-pixels in the first and second pixel units are axially symmetrical with respect to the imaginary line perpendicular to the connection line for connection the same colored sub-pixels.

* * * * *